United States Patent [19]

Feng et al.

[11] Patent Number: 5,081,563
[45] Date of Patent: Jan. 14, 1992

[54] MULTI-LAYER PACKAGE INCORPORATING A RECESSED CAVITY FOR A SEMICONDUCTOR CHIP

[75] Inventors: Bai-Cwo Feng, Tarrytown; George C. Feng, Fishkill; Richard H. McMaster, Wappingers Falls, all of N.Y.

[73] Assignee: International Business Machines Corporation, Armonk, N.Y.

[21] Appl. No.: 516,011

[22] Filed: Apr. 27, 1990

[51] Int. Cl.⁵ .............................................. H05K 1/11
[52] U.S. Cl. ................................... 361/414; 174/260; 174/261; 361/401; 361/412; 357/68; 357/80; 439/68; 439/69
[58] Field of Search .............. 174/52.1, 52.2, 52.3, 174/52.5, 52.6, 251, 255; 361/401, 412, 414, 417, 419; 29/832; 357/68, 69, 70, 71, 72, 73, 80; 439/68, 69, 71

[56] References Cited

U.S. PATENT DOCUMENTS

| | | | |
|---|---|---|---|
| 3,564,114 | 2/1971 | Binder et al. | 174/68.5 |
| 3,739,232 | 6/1973 | Grossman et al. | 317/101 |
| 3,881,971 | 5/1975 | Greer et al. | 156/11 |
| 3,903,590 | 9/1975 | Yokogawa | 357/80 |
| 4,080,414 | 3/1978 | Anderson | 264/41 |
| 4,245,273 | 1/1981 | Feinberg et al. | 361/382 |
| 4,371,744 | 2/1983 | Badet et al. | 361/414 |
| 4,466,181 | 8/1984 | Takishima | 29/589 |
| 4,513,355 | 4/1985 | Schroeder et al. | 174/52.61 |
| 4,539,622 | 9/1985 | Akasaki | 361/414 |
| 4,541,168 | 9/1985 | Galie et al. | 29/579 |
| 4,544,989 | 10/1985 | Hakabu et al. | 361/401 |
| 4,578,697 | 3/1986 | Takemae | 357/75 |
| 4,630,096 | 12/1986 | Drye et al. | 357/81 |
| 4,640,010 | 2/1987 | Brown | 29/832 |
| 4,702,792 | 10/1987 | Chow et al. | 156/628 |
| 4,783,722 | 11/1988 | Osaki et al. | 361/411 |
| 4,803,395 | 2/1989 | Kraus et al. | 361/412 |
| 4,821,151 | 4/1989 | Pryor et al. | 174/52.61 |
| 4,931,853 | 6/1990 | Ohuchi et al. | 357/68 |

FOREIGN PATENT DOCUMENTS

| | | |
|---|---|---|
| 1245517 | 11/1988 | Canada ........................ 117/100 |
| 0043029 | 6/1981 | European Pat. Off. . |
| 0072759 | 8/1982 | European Pat. Off. . |
| 0101791 | 4/1983 | European Pat. Off. . |
| 0346061 | 6/1989 | European Pat. Off. . |
| 2536624 | 3/1976 | Fed. Rep. of Germany . |
| 0002173 | 1/1977 | Japan ........................... 357/80 |
| 2810054 | 9/1978 | Japan ........................... 357/80 |
| 0191061 | 8/1986 | Japan ........................... 357/80 |
| 0225829 | 10/1986 | Japan ........................... 357/80 |

OTHER PUBLICATIONS

IBM Tech. Discl. Bul. vol. 22 No. 5 Oct. 1979 "Multi-layer Ceramic Fixed Layer Substrate Design", A. Johnson, J. Martyak, R. Ricci pp. 1841 and 1842.
IBM Technical Disclosure Bulletin, vol. 26 No. 9, Feb. I. Feinberg et al. "Interposer for Chip-on-Chip Module Attachment".
IBM Technical Disclosure Bulletin, vol. 14, No. 10, Mar. 1972, by P. Ehret et al., p. 3090.
IBM Technical Disclosure Bulletin, vol. 23, No. 7A Dec. 1980, by F. Motika, pp. 2770–2773.
IBM Technical Disclosure Bulletin, vol. 15, No. 2, Jul. 1972, by D. J. Bodendorf et al., pp. 656–657.

*Primary Examiner*—Leo P. Picard
*Assistant Examiner*—Donald A. Sparks
*Attorney, Agent, or Firm*—Jeffrey L. Brandt; Harold Huberfeld

[57] ABSTRACT

An electronic component package, including: a multi-layer ceramic or glass-ceramic substrate formed of a stacked plurality of generally parallel signal and insulating layers, each of the signal layers comprising an electrically conductive pattern; a cavity in a surface of the substrate sized to accommodate an electronic component with a planar surface of the electronic component disposed substantially planar with the surface of the substrate; and a plurality of electrical conductors extending from the surface of the substrate to selected ones of the signal layers for connecting the electronic component to the signal layers. Thin film wiring is provided for connecting the electronic component to the substrate.

7 Claims, 2 Drawing Sheets

MULTI-LAYER PACKAGE INCORPORATING A RECESSED CAVITY FOR A SEMICONDUCTOR CHIP

The present invention is directed generally to electronic component packaging, and more particularly to a package comprising multiple thin film layers.

BACKGROUND OF THE INVENTION

As semiconductor chips become increasingly dense, i.e. include a greater number of circuits per given area, it becomes increasingly difficult to provide adequate packaging for these chips. Such packaging must provide, for example, efficient and reliable interconnections for power distribution and internal and external signals, and adequate cooling to prevent overheating. Further, these packages must be small in size, economic to manufacture, and reliable in operation.

The problem of high-density, high-performance packaging has been addressed in a variety of manners, several of which are discussed below.

U.S. Pat. No. 4,466,181 to Takishima shows a package wherein multiple semiconductor chips are conjoined at the edges such that the surfaces supporting wire connectors are planar. The conjoined chips are mounted in a recess of a wiring board such that the planar chip surfaces are level with the surface of the wiring board. Conductors are then formed on the surface of the package to interconnect the chips with each other and with the wiring board. Takishima suffers from at least the one disadvantage that edge joining of chips is difficult at best and not practically applicable with respect to large numbers of chips.

U.S. Pat. No. 4,630,096 to Drye et al. shows a variety of chip packages or modules. FIG. 1 of Drye et al. shows a package wherein chips are set in the of a printed circuit board, and connected to wiring planes on the board by bonding wires. FIG. 3 of the patent shows a package wherein chips are set in recesses in a substrate and connected to wiring patterns on the substrate by bridge leads. FIGS. 4A-4D show packages wherein chips are mounted in through-holes of a silicon substrate and interconnected by planar metallization. FIGS. 6 and 7 show the packages of FIGS. 4 further mounted in a sealed package with connecting pins. These later embodiments shown in FIGS. 4, 6, and 7 suffer from. the disadvantage of the difficulties inherent in connecting electrical pins to a silicon substrate, making the package impractical for high-performance applications.

U.S. Pat. No. 4,578,697 to Takemae shows a package including a ceramic substrate having conductive strips situated thereon. Chips are fastened to the substrate so as to be insulated from the conductive strips. Connectors on the chips are bonded to the conductive strips by wires.

Ehret, P., et al., MULTICHIP PACKAGING, IBM Technical Disclosure Bulletin, Vol. 14, No. 10, Mar. 1972, pg. 3090, shows a package wherein chips connected by solder-ball bonds to a multilevel wiring substrate are sandwiched between the substrate and a heat sink. Pins extending through the heat sink are used to make electrical connections to the multilevel wiring substrate.

Motika, F., FLIP-CHIP ON PERSONALIZATION CHIP CARRIER PACKAGE, IBM Technical Disclosure Bulletin, Vol. 23, No. 7A, Dec. 1980, pgs. 2770-2773 shows a package wherein multiple chips are solder-ball bonded to a personalization chip. The personalization chip is joined to a pin-supporting ceramic substrate, and connected to the pins by a special type of edge joint or chip.

Bodendorf, D.J., et al., ACTIVE SILICON CHIP CARRIER, IBM Technical Disclosure Bulletin, Vol. 15, No. 2, July 1972, Pgs. 656-657, shows a package wherein small silicon chips supporting active FET devices are mounted on a larger silicon chip supporting active bipolar devices. The connections between the small and large silicon chips are made via a planar, multi-level metallurgy.

It is further known in the art to utilize multilayer ceramic (MLC) packages for semiconductor chips. Such packages are shown, for example, in U.S. Pat. Nos. 4,245,273 to Feinberg et al. and 4,080,414 to Anderson et al. (both assigned to the assignee of the present invention and incorporated herein by reference). These packages, however, typically require the use of solder-ball connections between the chips and the packages. This solder-ball technology is complex in nature. It requires that all of the power, ground, and signal interconnections be contained within the multi-layers of the MLC package. This can result in a complex, expensive package.

OBJECTS OF THE INVENTION

An object of the present invention is to provide a new and improved package for electronic components such as semiconductor devices.

Another object of the present invention is to provide such a package with increased interconnection density in comparison to the prior art.

Yet another object of the present invention is to provide such a package wherein the interconnections provided are more reliable than those of the prior art solder-ball connections.

A further object of the present invention is to provide such a package wherein the interconnections provided are cost-effective resulting in a relatively inexpensive package.

Another object of the present invention is to provide such a package which avoids the necessity of solder-ball bonding of semiconductor chips to the package while still accommodating such solder-ball bonding in instances where it is desirable.

A more specific object of the present invention is to provide such a package which utilizes both multilayer ceramic packaging and thin film interconnection technologies in a compatible manner to provide a high density of interconnections.

SUMMARY OF THE INVENTION

In accordance with the present invention, there is provided an electronic component package, comprising: a multilayer ceramic substrate including, at least two signal layers each including an electrically conductive pattern for conducting signals, and at least one ceramic insulating layer intermediate the at least two signal layers; a cavity in a surface of the substrate; an electronic component including bonding pads disposed in the cavity; at least two electrical conductors extending from the surface of the substrate to the at least two signal layers for connecting the electronic component to the at least two signal layers; and, multiple thin film layers of conducting and insulating materials disposed over the substrate and electronic component for connecting the bonding pads on the electronic component to the electrical conductors on the substrate.

BRIEF DESCRIPTION OF THE DRAWINGS

These and other objects, features, and advantages of the present invention will become apparent upon consideration of the following detailed description of the invention and drawing FIGS., in which.

DETAILED DESCRIPTION OF THE INVENTION

Figure 1:
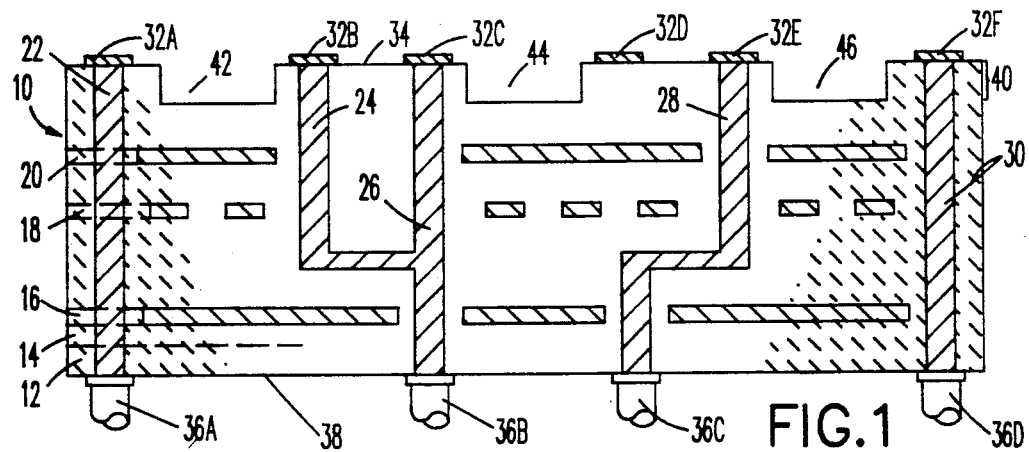
FIGS. 1-4 are consecutive, cross-sectional views of a semiconductor chip package manufactured in accordance with the present invention.

Referring now to the drawings, FIG. 1 shows a multi-layer ceramic or glass ceramic substrate 10 constructed in accordance with the present invention. As used herein, the term ceramic includes glass, ceramic, glass-ceramic, and combinations of these materials such as: alumina, alumina plus glass, cordierite glass ceramic, mullite, borosilicate glasses, and other such materials well known to those skilled in the art.

The fundamentals of constructing substrate 10, i.e. the metallizing, stacking, laminating, and firing of ceramic green sheets, are well known in the art. See for example, U.S. Pat. Nos. 3,564,114 to Blinder et al. (incorporated here by reference), and previously referenced 4,245,273 and 4,080,414.

In accordance with conventional multilayer ceramic substrate construction, substrate 10 comprises a plurality of horizontally stacked insulating and signal/reference-voltage layers, the signal layers including wiring metallization, and adjacent signal layers typically being separated by one or more insulating layers. See, for example, non-metallized insulating layers 12, 14, and metallized signal layers 16, 18, and 20. In a manner well known in the art, metallized signal layers 16, 18, and 20 are formed by screening the metal pattern directly onto a ceramic greensheet, the greensheets subsequently being stacked and sintered. Non-metallized ceramic greensheets may optionally be stacked intermediate metallized greensheets to provide greater thicknesses of insulating layers.

Further in a conventional manner, vertical conductive via columns, indicated at 22, 24, 26, 28, and 30, extend through substrate 10. Conductive via columns 22-30 are disposed generally perpendicular to the stacked layers 12-20, and function to make electrical connections between bonding pads 32A-32F on an upper surface 34 of the substrate, selected signal layers within the substrate, and metal wiring pins 36A-36D connected on a bottom surface 38 of the substrate.

In accordance with the present invention, the stacked layers forming upper region 40 of substrate 10 are formed with apertures, such that when these layers are stacked and processed in the manner described hereinabove, resulting substrate 10 includes cavities 42, 44, 46 extending from surface 34 into the body of substrate 10. As is described in further detail below, each cavity 42, 44, 46 is sized to support a semiconductor chip such that a chip surface is generally parallel to substrate surface 34.

Figure 2:
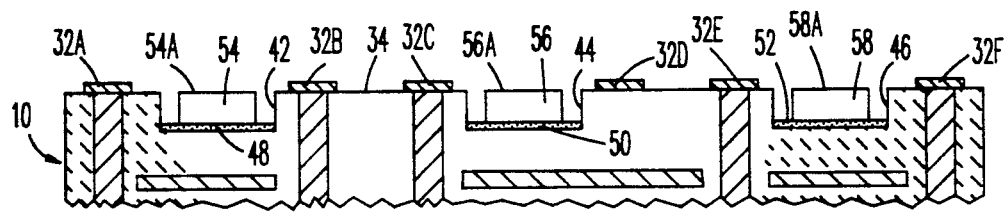

Referring now to FIG. 2, thin layers of bonding material 48, 50, 52 are deposited in the bottoms of cavities 42, 44, 46, respectively. Bonding material 48, 50, 52 comprises, for example, a eutectic alloy such as a gold eutectic, an epoxy such as a diamond-filled epoxy, or a polyimide, deposited to an appropriate thickness. Semiconductor chips 54, 56, and 58 are then deposited one-each into cavities 42, 44, and 46. In the present embodiment of the invention, each semiconductor chip 54, 56, 58 supports multiple electronic components or elements (not shown) such as transistors and resistors. Each chip includes an upper surface, designated at 54A, 56A, and 58A, that supports conductive bonding pads or contacts (not shown), each contact provided for making an electrical connection to a component within the chip. As is illustrated in FIG. 2, when substrate 10 is formed, cavities 42, 44, and 46 are formed such that they accommodate the semiconductor chips with their upper contact surfaces 54A, 56A, and 58A generally planar with substrate surface 34.

Figure 3:
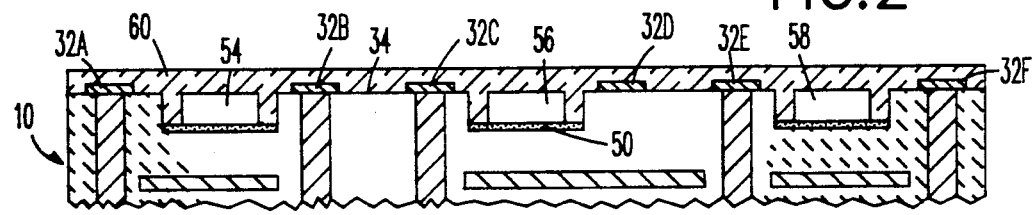

Referring now to FIG. 3, a thin film layer 60 of insulating material is formed generally conformally over surface 34 of substrate 10 so as to cover the surfaces 54A, 56A, 58A of the semiconductor chips, and to fill any gaps between the sides of these chips and the surfaces of cavities 42, 44, and 46. Layer 60 can comprise many known thin film insulating materials, such as silicon dioxide ($SiO_2$) or silicon nitride ($Si_3N_4$) as can be formed by conventional chemical vapor deposition (CVD) processes, sputtered or spun-on glass, a low thermal-coefficient-of-expansion (TCE) polyimide, or stacks of these same types of insulating materials. The TCE of layer 60 is desirably selected to closely match the TCE of substrate 10, whereby to provide a structure resistant to thermal cycling-induced failures.

Figure 4:
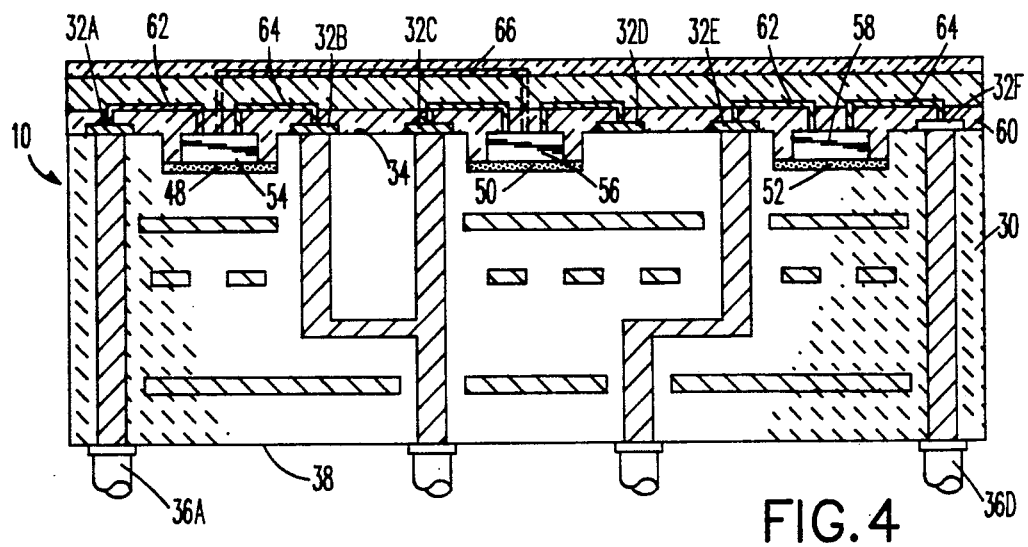

Referring now to FIG. 4, vias are selectively formed in layer 60, and a thin layer of metallization is deposited so as to form wires or interconnects such as interconnect 62 between chip 54 and bonding pad 32A, and interconnect 64 between chip 54 and bonding pad 32B. Multiple such thin films of insulating layers and metallization are formed so as to provide further conductive interconnects, such as interconnect 66 between semiconductor chips 54 and 56. It is to be understood that each layer of thin film metallization can include both inter- and intra-chip wire connections, as well as chip-to-substrate connections of the type shown at 62 and 66.

For example and without limitation, several different methods of forming the thin film wiring layers shown in FIG. 4 are described in the following patents: U.S. Pat. No. 3,881,971 to Greer et al., U.S. Pat. No. 4,702,792 to Chow et al., Canada 1,245,517 to Beyer et al., and U.S. Pat. No. 4,541,168 to Galie et al., each of which is assigned to the assignee of the present invention and incorporated herein by reference.

There is thus provided in FIG. 4 a semiconductor chip package wherein thin film metallization is utilized to connect and interconnect semiconductor chips with a multilayer ceramic substrate. This thin film metallization provides a very high density of very reliable interconnections, and is used instead of the lower-density, more complicated and more failure-prone solder-ball connections of the prior art.

Figure 5:
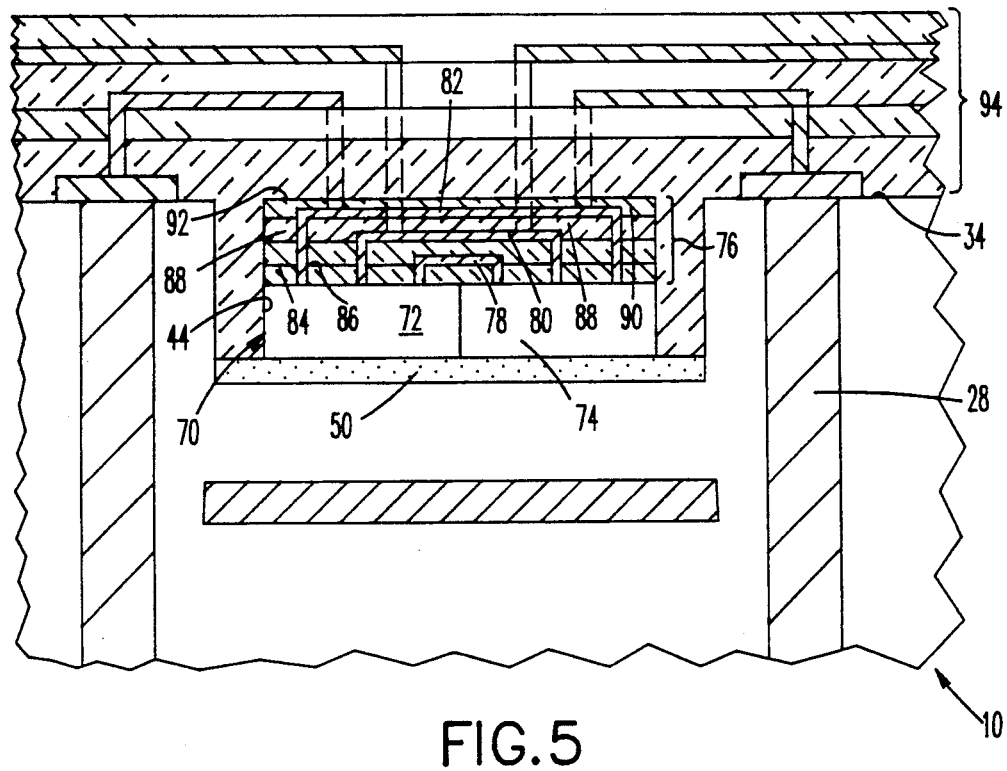
FIG. 5 is a view similar to FIG. 4 showing an embodiment of the present invention wherein multiple, interconnected chips are disposed within each chip site on the package.

Referring now to FIG. 5, an enlarged view around cavity 44 is shown illustrating an alternate embodiment of the present invention. In this embodiment of the invention, a multiple chip structure 70 is situated in cavity 44, versus the single chip (i.e. chip 56) shown and described above.

Chip structure 70 includes at least two adjoining semiconductor chips 72, 74 set directly onto epoxy layer 50 so as to be bonded within cavity 44. Structure 70 further includes inter/intra-chip wiring levels 76 formed directly on chips 72, 74 before the chips are mounted in cavity 44. Wiring levels 76, formed from the same thin-film wiring products and processes described above, includes multiple conductive/metal interconnects 78, 80, 82 disposed intermediate insulating layers 84, 86, 88, and 90. Wiring levels 76 and cavity 44 are sized such that an upper surface 92 of the wiring levels is generally planar with upper surface 34 of substrate 10.

Further thin film wiring levels 94, fabricated in accordance with the methods described hereinabove, are formed over surface 34 of substrate 10 so as to provide conductive interconnects between chip structure 70 and conductive pads on the substrate.

Figure 6:
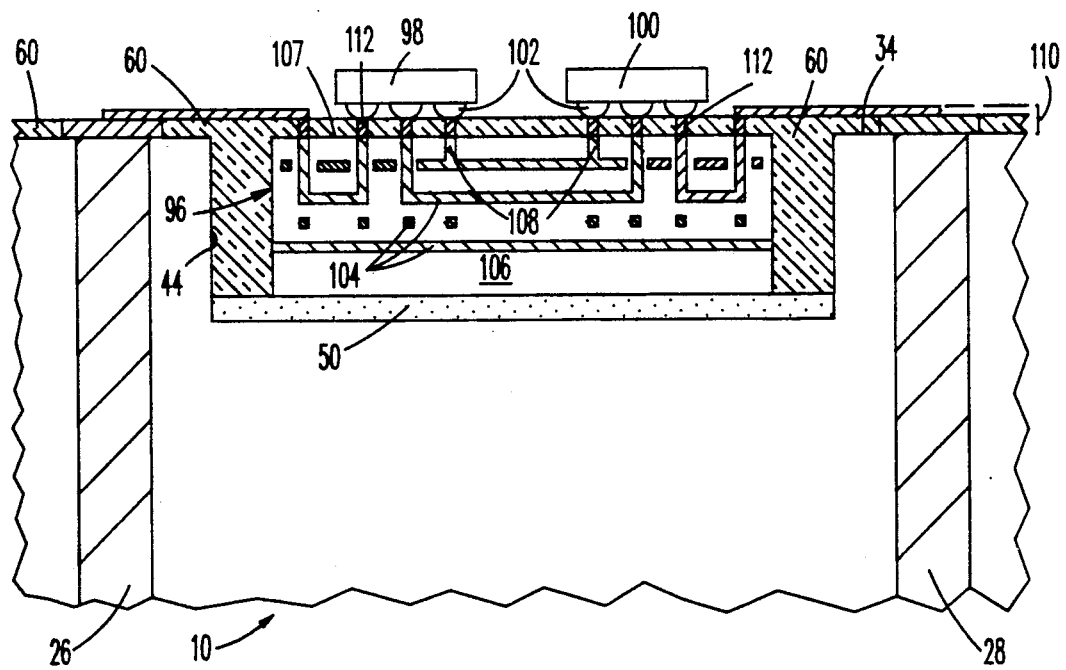
FIG. 6 is a view similar to FIG. 4 showing an embodiment of the present invention wherein an interposer chip for supporting solder-ball connections is disposed within a chip site on the package.

Referring now to FIG. 6, a view similar to that of FIG. 5 is shown illustrating yet another embodiment of the present invention. In this embodiment, an interposer chip 96 is shown disposed in cavity 44 for mounting semiconductor chips 98, 100 via solder ball connections 102.

Interposer chip 96 comprises metal interconnections 104 disposed in an insulator 106 and can be formed, for example, using the same thin film technology described hereinabove. Chip 96 includes an upper surface 107 generally parallel to upper surface 34 of substrate 10, the chip upper surface including various bonding pads and exposed metal interconnects such as those indicated at 108. Single or multiple thin film wiring levels 110 are formed over chip 96 for connecting the chip to conductive pads on substrate 10 as described above. Metal-filled vias such as those indicated at 112 are provided in wiring levels 110 for mounting chips 98, 100 on interposer 96 via solder balls 102. Chips 98, 100 are thus intra- and interconnected via interposer 96, and connected to substrate 10 and the various signal levels therein via wiring levels 110.

The embodiment of the invention shown in FIG. 6 thus utilizes the above-described benefits of multilayer ceramic packaging and thin film wiring, while still accommodating solder-ball bonding.

There is thus provided a new and improved multilevel ceramic package for semiconductor chips wherein the chips are recessed within the package and thin film wiring levels are used for intra-chip, inter-chip, and chip-package connections. The present invention provides the benefit of highly reliable, high-density packaging. This increased density permits heavier wiring to be used in selected locations within the package, yielding improved power distribution and decreased noise. Further, the present invention obviates the necessity for prior-art solder-ball connections, while still accommodating such connections as desired.

The present invention has particular application in the packaging of large and very large scale integrated circuit semiconductor chips.

While the present invention has been shown and described with respect to specific embodiments, it is not so limited. Numerous modifications, changes, and improvements within the scope and spirit of the invention will occur to those skilled in the art.

What is claimed is:

1. An electronic component package, comprising:
   a multilayer ceramic substrate including,
      at least two signal layers each including an electrically conductive pattern for conducting signals, and
      at least one ceramic insulating layer intermediate said at least two signal layers;
   a cavity in a surface of said substrate;
   an electronic component including bonding pads disposed in said cavity;
   at least two electrical conductors extending from said surface of said substrate to said at least two signal layers for connecting said electronic component to said at least two signal layers; and
   multiple thin film layers of conducting and insulating materials disposed over said substrate and electronic component for connecting said bonding pads on said electronic component to said electrical conductors on said substrate.

2. An electronic component package, comprising:
   a multilayer ceramic substrate comprising a stacked plurality of generally parallel signal and insulating layers, each of said signal layers comprising an electrically conductive pattern;
   at least one electronic component including conductive bonding pads on a generally planer surface;
   a cavity in a surface of said substrate supporting said electronic component with said surface of said electronic component disposed substantially planar with said surface of said substrate;
   a plurality of electrical conductors extending from said surface of said substrate to selected ones of said signal layers for connecting said electronic component to said signal layers; and
   multiple thin film layers of conducting and insulating materials disposed over said substrate and electronic component surfaces for connecting said bonding pads on said electronic component to said electrical conductors on said substrate.

3. The package of claim 2 and further including a layer of epoxy disposed intermediate the surface of said cavity and said electronic component for supporting said electronic component in said cavity.

4. The package of claim 2 wherein at least two of said electronic components are disposed in said cavity.

5. The package of claim 4 and further including means disposed in said cavity for interconnecting said at least two electronic components.

6. The package of claim 2 wherein said electronic component comprises an interposer chip including multiple electrical interconnections, and said package further comprising:
   bonding pads on an upper surface of said interposer chip for supporting solder ball connections whereby a second electronic component can be solder ball bonded to said interposer.

7. An electronic component package, comprising:
   a multilayer ceramic substrate comprising a stacked plurality of generally parallel signal and insulating layers, each of said signal layers comprising an electrically conductive pattern;
   a cavity in a surface of said substrate sized to accommodate an electronic component; at least one electronic component disposed in said cavity, said electronic component including at least one generally planar surface disposed substantially planar with said surface of said substrate, said electronic component further including conductive bonding pads on said planar surface thereof;

a plurality of electrical conductors extending from the surface of said substrate to selected ones of said signal layers for connecting said electronic component to said signal layers; and multiple thin film layers of insulating and conducting materials disposed over said surfaces of said substrate and said electronic component for selectively making wire connections between features on said electronic component, and between said bonding pads on said electronic component and said electrical conductors on said substrate.

* * * * *